(12) United States Patent
Liu et al.

(10) Patent No.: US 12,255,097 B2
(45) Date of Patent: Mar. 18, 2025

(54) SPLASH RESISTANT LASER WAFER SINGULATION BY CRACK LENGTH CONTROL

(71) Applicant: Texas Instruments Incorporated, Dallas, TX (US)

(72) Inventors: Yang Liu, Sichuan (CN); Hao Zhang, Sichuan (CN); Venkataramanan Kalyanaraman, Allen, TX (US); Joseph O Liu, Plano, TX (US); Qing Ran, Sichuan (CN); Yuan Zhang, Sichuan (CN); Gelline Joyce Untalan Vargas, Marikina (PH); Jeniffer Otero Aspuria, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 535 days.

(21) Appl. No.: 17/537,883

(22) Filed: Nov. 30, 2021

(65) Prior Publication Data
US 2023/0170257 A1    Jun. 1, 2023

(51) Int. Cl.
| H01L 21/78 | (2006.01) |
| B23K 26/38 | (2014.01) |
| H01L 21/66 | (2006.01) |
| H01L 21/67 | (2006.01) |
| H01L 23/00 | (2006.01) |
| H01L 23/544 | (2006.01) |
| B23K 101/40 | (2006.01) |

(52) U.S. Cl.
CPC .............. *H01L 21/78* (2013.01); *B23K 26/38* (2013.01); *H01L 21/67115* (2013.01); *H01L 21/67288* (2013.01); *H01L 22/12* (2013.01); *H01L 23/544* (2013.01); *H01L 23/562* (2013.01); *B23K 2101/40* (2018.08)

(58) Field of Classification Search
CPC .... H01L 21/67115; H01L 21/78; B23K 26/38
See application file for complete search history.

(56) References Cited

U.S. PATENT DOCUMENTS

| 2014/0117505 A1* | 5/2014 | Mackh ................... H01L 23/562 257/620 |
| 2019/0217420 A1 | 7/2019 | Vanagas et al. |
| 2020/0051860 A1* | 2/2020 | Wyant ............... H01L 21/67092 |
| 2020/0176314 A1* | 6/2020 | Sherbin ................. H01L 23/562 |

* cited by examiner

*Primary Examiner* — Walter H Swanson
*Assistant Examiner* — Jacob T Nelson
(74) *Attorney, Agent, or Firm* — Ronald O. Neerings; Frank D. Cimino

(57) ABSTRACT

A method of dicing a wafer includes positioning the wafer with its top side on a tape material. The wafer includes a plurality of die separated by scribe streets. A first pass being a first infrared (IR) laser beam is directed at the bottom side with a point of entry within the scribe streets. The first IR laser beam is focused with a focus point embedded within a thickness of the wafer, and has parameters selected to form an embedded crack line within the wafer. The embedded crack line does not reach the top side surface. A second pass being a second IR laser beam is directed at the bottom side having parameters selected to form a second crack line that that has a spacing relative to the embedded crack line, and the second IR laser beam causes the embedded crack line to be extended to the top side surface.

21 Claims, 2 Drawing Sheets

SPLASH RESISTANT LASER WAFER SINGULATION BY CRACK LENGTH CONTROL

FIELD

This Disclosure relates to laser-based wafer singulation, also known as wafer dicing.

BACKGROUND

Semiconductor die are typically manufactured by dicing a semiconductor substrate generally referred to as being a semiconductor wafer that is at least 6 inches in diameter (150 mm), such as 8 inches (200 mm) in diameter, or 12 inches (300 mm) in diameter. The wafer comprises a plurality of semiconductor die of a predetermined die size, which are diced into a plurality of singulated die. When dicing a wafer, an adhesive dicing tape is attached on the bottom side (or back side) surface of the wafer to prevent the die from falling apart from one another, and then the wafer is generally cut from the active top side (or front side) using a mechanical saw to singulate the die.

Mechanical dicing saws provide die separations of generally about 40 μm, so that the die separations called scribe streets between the die are made wide enough for such cuts. The scribe streets may include metal containing test structures (e.g., drop-ins). At this time, the dicing tape attached to the bottom side surface of the wafer is slightly cut into its surface but not entirely cut through, and the semiconductor die remain held on the dicing tape. After singulation, a wafer expander is used to provide tape expansion that spreads apart the singulated die to enable a die picker to pick up the diced die one-by-one from the dicing tape, and the singulated die are then transferred to a subsequent assembly step such as a die bonding step.

Laser saws for dicing are known as alternative to mechanical dicing saws. Laser saws enable die separations of much less in width as compared to mechanical saws. The laser energy is focused at a particular focus depth. The concentration of energy leads to a localized high heat level. This high heat level results in local expansion of the substrate material such as silicon that results in micro-cracks being formed in the substrate. There are two common methods used in the semiconductor industry.

In ablation dicing, the focal point of the laser beam is directed at the active top surface of the wafer. The concentration of energy leads to removal of a small amount of substrate material near the top side surface by vaporization. This results in a groove on the top side surface which acts as a guide for mechanical dicing. This method can have superior performance as compared to mechanical dicing only.

A second known wafer dicing method involves what is referred generally to as being performed by "Stealth laser dicers". For silicon wafers, near-infrared (near IR) pulsed lasers are used by stealth laser dicers because of the undesired silicon absorption of shorter wavelengths (e.g., visible light) by silicon. Stealth laser dicers dice the wafer with the beam incident on the bottom side surface of the wafer due to reasons including needing a different configuration to handle the wafer on a flex frame due different points of contact to transport a frame or wafer, and the need for a new dicing tape or an unconventional backgrind tape on the top side surface of the wafer that allows for near infrared radiation (IR) to transmit through it.

The laser energy is thus excited from the bottom side of a wafer and is focused at a certain depth from the bottom. The pulsed IR laser beam concentrates the energy at the focus point. This concentration of energy leads to increase in temperature at the focus point and rapid thermal expansion. Due to the sudden thermal shock a localized damage zone (called stealth damage) develops at the focal point and micro-cracks emanate in the vertical direction both above and below the stealth damage region from the stealth damage region. The total length of this micro-crack in the vertical direction is referred to as being a crack-length. For relatively thick wafers multiple stealth damage regions are created at different focus depths, each with its own crack lengths. Tape expansion "cleaves" the wafer along the damage zone and connects the different cracks in the vertical direction. This process utilizes the natural crystal cleave planes to separate the respective dies and results in superior side wall quality compared to mechanical dicing alone.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize that one of the challenges of stealth laser dicing with multiple laser beam passes is that the power, position and spacing of each of the passes needs to be properly set. This is because too low of a power can lead to a very small crack-length that can result in lack of die separation and yield loss. Too high of a power can lead to the second pass reflecting from the micro-cracks created by the first pass.

Similarly, if the first pass laser beam is located too close to the top side surface that includes circuitry, the beam energy may scatter onto the circuitry leading to damage near the circuitry resulting in what is called first pass splash. If the first pass laser beam is positioned too far from the top side surface, then the cracks do not develop correctly relative to the top side surface, and the cracks can result in meandering defects or poor side-wall cut quality.

The respective damage crack lines also need to be separated by a critical length in the vertical direction. Too large of a separation between the respective crack lines will lead to the crack lines not connecting with each other during tape separation, and can result a high yield loss. Too small of a separation between the crack lines can lead to the second laser pass reflecting from the crack line created by the first laser pass. The beam energy may scatter onto the circuitry leading to damage near the circuitry resulting in what is called second pass splash.

Reflected beams of energy grazing into the circuitry on the top side of the die can get absorbed by the polysilicon or metal lines typically on the die. These type of energy absorptions leads to thermal agglomeration of material and can result in voiding or extrusion of polysilicon or the metal interconnects. Depending on the layout and dimensions of the interconnect, this can result in shorts, opens, resistive opens, or resistive shorts for the die.

Power and spacing to the top side circuitry and spacing between the respective crack lines have been historically determined by iteratively adjusting parameters to achieve high levels of separation. However, no algorithm or method is believed to exist for this particular purpose.

Wafer Chip Scale Package (WCSP) die/devices are typically electrically tested to screen defective die prior to laser dicing. As a result, any defects introduced by the laser dicing process itself cannot be detected in manufacturing, and as a result such defects pose serious WCSP die quality challenges. Additionally, the laser damage components may not have observability in the test scheme that is utilized, and this poses a challenge to detect laser induced defects even if electrical testing of the WCSP die is performed.

Disclosed aspects include a method of dicing a semiconductor wafer including positioning the semiconductor wafer with a top side having circuitry and a bottom side, with the top side on a tape material, (such as backgrinding tape also known as a dicing tape). The semiconductor substrate has at least a semiconductor surface on the top side including a plurality of semiconductor die having circuitry that are separated from one another by scribe streets, and a bottom side. A first pass comprising a pulsed first IR laser beam is directed at the bottom side that is at a wavelength capable of transmitting through the semiconductor wafer with a point of entry at the scribe streets. The first IR laser beam is focused with a focal point embedded within a thickness of the wafer. The parameters for the first IR laser beam are selected so that there is an embedded crack line formed within the wafer, where the embedded crack line does not reach a surface of the top side.

A typical distance range that the embedded crack line is separated from the top side surface is generally 10 μm to 30 μm. A second pass comprising a second IR laser beam is directed at the bottom side with the top side of the wafer remaining on the tape so that both the first pass and the second pass enter from the bottom side of the wafer. The parameters for the second IR laser beam generally include a lower energy as compared to the first pass, and the parameters for the second pass are selected to form a second crack line that extends toward the embedded crack line but does not reach the embedded crack line, and further causes the embedded crack line to extend to the top side surface.

BRIEF DESCRIPTION OF THE DRAWINGS

Reference will now be made to the accompanying drawings, which are not necessarily drawn to scale, wherein.

DETAILED DESCRIPTION

Figure 1:
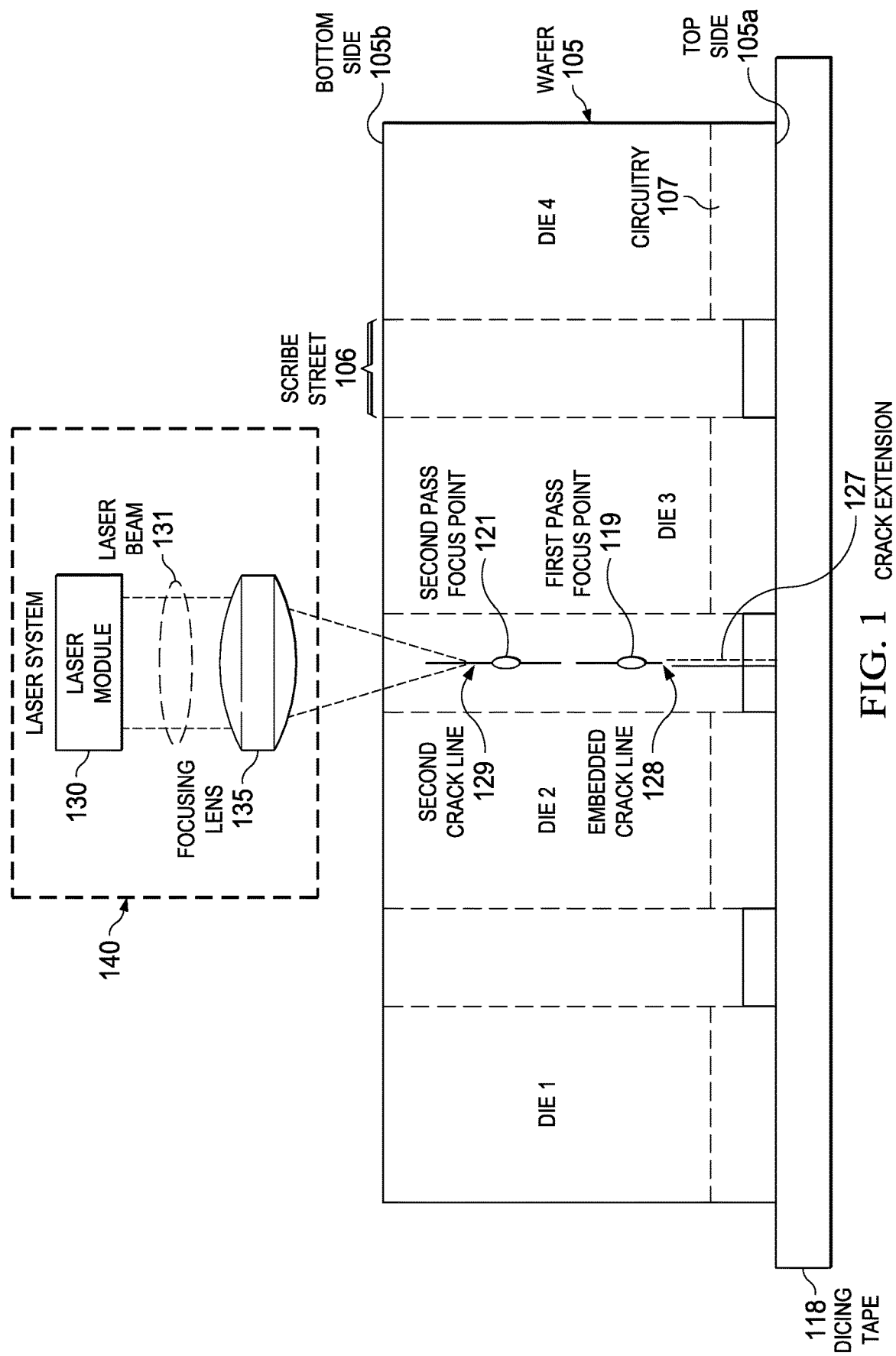
FIG. 1 is depiction of a laser dicing system implementing a disclosed method of stealth laser-based wafer dicing, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

FIG. 1 is depiction of a laser dicing system shown as a laser system 140 implementing a disclosed method of stealth laser-based wafer dicing, according to an example aspect. The laser system 140 includes a laser module 130 for generating an IR laser beam 131 that is generally a near-IR laser having a modulator for generating a pulsed IR beam, and a focusing lens 135 that may be referred to as a condensing lens. The laser module 130 also generally includes a scanner for scanning the laser beam (relative to the wafer) at a selected scan rate.

The laser system 140 is shown lasering a semiconductor wafer 105 that includes a top side 105a (which can also be referred to as being the front side) having circuitry 107 (e.g., transistors) including scribe streets 106 between the die on the wafer 105 shown as die 1, die 2, die 3, and die 4, with each die having circuitry 107 positioned between the scribe streets 106. The surface of the top side 105a of the wafer 105 is shown on a dicing tape 118 so that the bottom side 105b receives the incident laser beams.

The IR laser beam 131 is at a wavelength capable of transmitting through the wafer 105 and is directed so that a point of entry is within the scribe streets 106 on the bottom side 105b of the wafer 105. A first pass focus (focal) point 119 of a first pass of the IR laser beam 131 is configured to be embedded within a thickness of the wafer 105 to form an embedded crack line 128. The second pass' focus point 121 of the IR laser beam 131 is performed at an energy that is lower than the first pass so that the resulting second crack line 129 is shallower (closer to the bottom side 105b) as compared to the embedded crack line 128. Ideally, the respective crack lines formed should be only vertically oriented, but with relatively high laser power and at corners the crack lines may not be entirely vertical, and this can cause the next laser pulse lateral to the previous laser pulse in the same scribe line which typically comprises plurality of laser pulses, to strike at a position which has already been cracked.

In lasing operation, the IR laser beam 131 is typically pulsed by the modulator at a frequency of about 50 kHz to 200 kHz, such as 100 kHz, while the wafer 105 is moved relative to the IR laser beam 131 with a velocity of about 0.5 m/sec to 2 m/s. The IR laser beam 131 is scanned to stay within the scribe streets 106 to encircle each die on the wafer 105. The laser module 130 can comprise a pulsed Nd:YAG laser outputting a wavelength of 1,064 nm which can be used for silicon dicing applications because the room temperature band gap of silicon is about 1.11 eV (1,117 nm), so that maximum laser absorption can be adjusted by optical focusing.

After laser dicing the wafer 105, the wafer 105 generally remains on the dicing tape 118 which is then expanded in a die expander apparatus. The die expansion step connects the respective crack lines by propagating the cracks along the natural crystal cleave planes in the thickness direction of the wafer 105 to dice the wafer 105 into separate (singulated) individual semiconductor die. The wafer 105 is generally not singulated into separate semiconductor die until after die expanding.

The optical system including the focusing lens 135 can optionally be incorporated into a dicing machine. For example, Tokyo Seimitsu's Mahoh laser dicing machine (ML200/ML300) and in Disco Corp.'s DFL7340/DFL7360 laser dicing machines. For disclosed aspects no hardware modification of the laser dicer is generally needed.

As noted above, the first and second passes are each generally applied at a plurality of different width/area scribe street locations in each scribe street across the entire width of wafer to form what may be referred to as being as pock marks. The number of pock marks formed in each scribe street is generally dependent on the frequency of the laser pulse and speed with which the wafer is moving.

Figure 2:
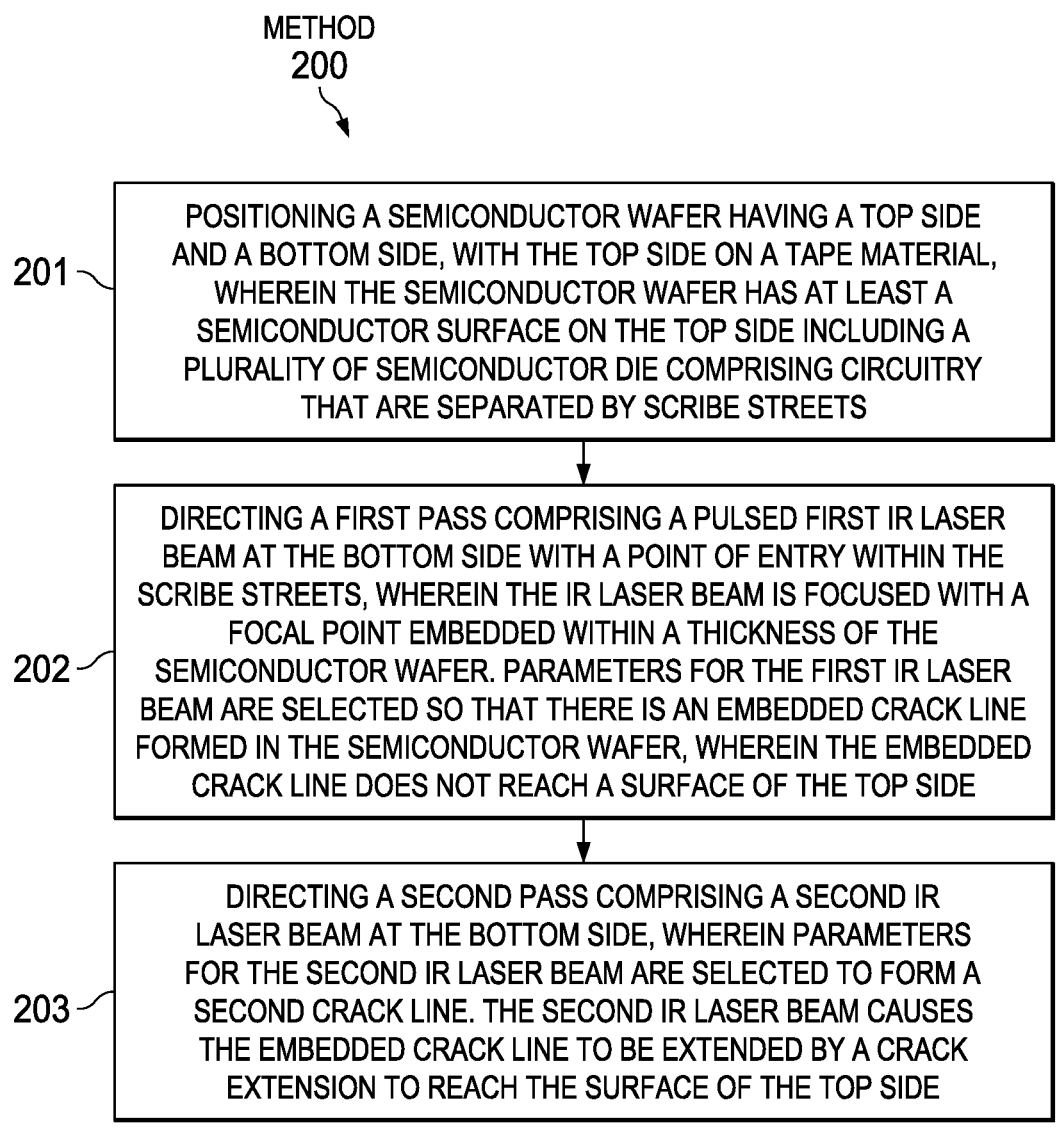
FIG. 2 is a flow chart that shows steps in an example method of stealth laser-based wafer dicing.

FIG. 2 is a flow chart that shows steps in an example method 200 of laser-based wafer dicing of a semiconductor wafer. Step 201 comprises positioning the semiconductor wafer having a top side and a bottom side, with the top side on a tape material, wherein the semiconductor wafer has at least a semiconductor surface on the top side including a plurality of semiconductor die comprising circuitry that are separated by scribe streets. Step 202 comprises directing a first pass comprising a pulsed first IR laser beam at the bottom side with a point of entry within the scribe streets, wherein the IR laser beam is focused with a focal point embedded within a thickness of the semiconductor wafer. The parameters for the first IR laser beam are selected so that there is an embedded crack line (see the embedded crack line 127 shown in FIG. 1) formed in the semiconductor wafer, wherein the embedded crack line does not reach the surface of the top side.

Step 203 comprises directing a second pass comprising a second IR laser beam at the bottom side, wherein parameters for the second IR laser beam, including generally a lower energy compared to the first pass, are selected to form a second crack line. The second IR laser beam causes the embedded crack line to be extended by a crack extension to reach the surface of the top side. The parameters for the second IR laser beam can include a crack length of the embedded crack line, which is beyond the conventional laser dicing parameters of power and frequency.

The spacing between the embedded crack line and the second crack line in the vertical direction can be between 18 µm and 60 µm. If the spacing between respective crack lines is too small, the second crack line may not be able to extend to the bottom side surface of wafer and this can cause the die to cleave poorly during tape separation at corners of the die, that can result in corner chipping. The interaction can also cause scattering of the second IR laser beam's energy on the circuitry on the top side of the die. On the other hand, if the spacing between the respective crack lines is to too large, the respective crack lines may not connect with each other during tape expansion which may lead to the risk of an un-separation.

The embedded crack line at the time of formation may be separated from the top side surface by a distance of 10 µm to 30 µm. The method can also include the step of determining at least one parameter for the first IR laser beam and for the second IR laser beam using a blank (no circuitry) wafer coated with a metal having a melting point of less than 300° C., such as tin, positioned on the top side. Using this method any wayward laser pulses will generally cause the low melting point metal such as Tin to melt which makes it easy to observe splash damage. Because this method does not rely on circuit damage, this method has a high sensitivity to observe splash damage.

The second IR laser beam can be at an energy of no more than 70%, such as at an energy of no more than 50%, of an energy of the first IR laser beam. The respective IR laser beams are typically pulsed at a frequency of 50 kHz to 200 kHz. The method can further comprise separation of the respective semiconductor die during a separating process using an expander that expands the tape material.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A method of dicing a semiconductor wafer, comprising:
positioning the semiconductor wafer having a top side and a bottom side with the top side on a tape material, wherein the semiconductor wafer has at least a semiconductor surface on the top side including a plurality of die comprising circuitry that are separated by scribe streets;
directing a first pass comprising a first infrared (IR) laser beam at the bottom side with a point of entry within the scribe streets, wherein the first IR laser beam is focused with a focus point embedded within a thickness of the semiconductor wafer, wherein parameters for the first IR laser beam are selected so that there is an embedded crack line formed within the semiconductor wafer, and wherein the embedded crack line does not reach a surface of the top side;
directing a second pass comprising a second IR laser beam at the bottom side, wherein parameters for the second IR laser beam are selected to form a second crack line that has a spacing in a vertical direction relative to the embedded crack line, and the second IR laser beam causes the embedded crack line to be extended by a crack extension to reach the surface of the top side, wherein the spacing between the embedded crack line and the second crack line in the vertical direction is between 18 µm and 60 µm.

2. A method of dicing a semiconductor wafer, comprising:
positioning the semiconductor wafer having a top side and a bottom side with the top side on a tape material, wherein the semiconductor wafer has at least a semiconductor surface on the top side including a plurality of die comprising circuitry that are separated by scribe streets;
directing a first pass comprising a first infrared (IR) laser beam at the bottom side with a point of entry within the scribe streets, wherein the first IR laser beam is focused with a focus point embedded within a thickness of the semiconductor wafer, wherein parameters for the first IR laser beam are selected so that there is an embedded crack line formed within the semiconductor wafer, wherein the embedded crack line does not reach a surface of the top side, and wherein the embedded crack line at a time of formation is separated from the surface of the top side by a distance of 10 µm to 30 µm; and
directing a second pass comprising a second IR laser beam at the bottom side, wherein parameters for the second IR laser beam are selected to form a second crack line that has a spacing in a vertical direction relative to the embedded crack line, and the second IR laser beam causes the embedded crack line to be extended by a crack extension to reach the surface of the top side.

3. A method of dicing a semiconductor wafer, comprising:
positioning the semiconductor wafer having a top side and a bottom side with the top side on a tape material, wherein the semiconductor wafer has at least a semiconductor surface on the top side including a plurality of die comprising circuitry that are separated by scribe streets directing a first pass comprising a first infrared (IR) laser beam at the bottom side with a point of entry within the scribe streets, wherein the first IR laser beam is focused with a focus point embedded within a thickness of the semiconductor wafer, wherein parameters for the first IR laser beam are selected so that there is an embedded crack line formed within the semiconductor wafer, and wherein the embedded crack line does not reach a surface of the top side; and directing a second pass comprising a second IR laser beam at the bottom side, wherein parameters for the second IR laser beam are selected to form a second crack line that has a spacing in a vertical direction relative to the embedded crack line, and the second IR laser beam causes the embedded crack line to be extended by a crack extension to reach the surface of the top side, wherein the determining the parameters for the first IR laser beam and for the second IR laser beam include using a blank wafer coated with metal having a melting point of less than 300° C.

4. The method of claim 3, wherein the metal comprises tin.

5. The method of claim 3, wherein the parameters for the second IR laser beam include a crack length of the embedded crack line.

6. The method of claim 3, wherein IR laser beam is pulsed at a frequency of 50 kHz to 200 kHz.

7. The method of claim 3, further comprising separation of the plurality of die during a separating process using an expander that expands the tape material.

8. A method of dicing a semiconductor wafer, comprising:
positioning the semiconductor wafer having a top side and a bottom side with the top side on a tape material, wherein the semiconductor wafer has at least a semiconductor surface on the top side including a plurality of die comprising circuitry that are separated by scribe streets;

directing a first pass comprising a first infrared (IR) laser beam at the bottom side with a point of entry within the scribe streets, wherein the first IR laser beam is focused with a focus point embedded within a thickness of the semiconductor wafer, wherein parameters for the first IR laser beam are selected so that there is an embedded crack line formed within the semiconductor wafer, and wherein the embedded crack line does not reach a surface of the top side; and directing a second pass comprising a second IR laser beam at the bottom side, wherein parameters for the second IR laser beam are selected to form a second crack line that has a spacing in a vertical direction relative to the embedded crack line, and the second IR laser beam causes the embedded crack line to be extended by a crack extension to reach the surface of the top side, wherein the second IR laser beam is at an energy of no more than 70% of an energy of the first IR laser beam.

9. The method of claim 8, wherein the parameters for the second IR laser beam include a crack length of the embedded crack line.

10. The method of claim 8, wherein IR laser beam is pulsed at a frequency of 50 kHz to 200 kHz.

11. The method of claim 8, further comprising separation of the plurality of die during a separating process using an expander that expands the tape material.

12. A method of dicing a semiconductor wafer, comprising:
positioning the semiconductor wafer having a top side and a bottom side with the top side on a tape material, wherein the semiconductor wafer has at least a semiconductor surface on the top side including a plurality of die comprising circuitry that are separated by scribe streets;

directing a first pass comprising a first infrared (IR) laser beam at the bottom side with a point of entry within the scribe streets, wherein the first IR laser beam is focused with a focus point embedded within a thickness of the semiconductor wafer, wherein parameters for the first IR laser beam are selected so that there is an embedded crack line formed within the semiconductor wafer, and wherein the embedded crack line does not reach a surface of the top side; and directing a second pass comprising a second IR laser beam at the bottom side, wherein parameters for the second IR laser beam are selected to form a second crack line that has a spacing in a vertical direction relative to the embedded crack line, and the second IR laser beam causes the embedded crack line to be extended by a crack extension to reach the surface of the top side, wherein natural crystal cleave planes are not used in separating a first of the plurality of die from a second of the plurality of die along the crack extension that reaches the surface of the top side.

13. A method of dicing a semiconductor wafer, comprising:
positioning the semiconductor wafer having a top side and a bottom side with the top side on a tape material, wherein the semiconductor wafer has at least a silicon surface on the top side including a plurality of die comprising circuitry that are separated by scribe streets;

directing a first pass comprising a pulsed first infrared (IR) laser beam at the bottom side with a point of entry within the scribe streets, wherein the pulsed first IR laser beam is focused with a focus point embedded within a thickness of the semiconductor wafer, and wherein parameters for the first IR laser beam are selected so that there is an embedded crack line formed in the semiconductor wafer, and wherein the embedded crack line does not reach the silicon surface, and directing a second pass comprising a second IR laser beam at the bottom side, wherein parameters for the second IR laser beam including a crack length of the embedded crack line are selected to form a second crack line that that has a spacing in a vertical direction to the embedded crack line, and the second IR laser beam causes the embedded crack line to be extended by a crack extension to reach the silicon surface, wherein the spacing between the embedded crack line and the second crack line in the vertical direction is between 18 μm and 60 μm.

14. The method of claim 13, wherein natural crystal cleave planes are not used in separating a first of the plurality of die from a second of the plurality of die along the crack extension that reaches the surface of the top side.

15. The method of claim 13, wherein the embedded crack line at a time of formation is separated from the silicon surface by a distance of 10 μm to 30 μm.

16. The method of claim 13, wherein the second IR laser beam is at an energy of no more than 70% of an energy of the first IR laser beam.

17. The method of claim 13, wherein the determining the parameters for the first IR laser beam and for the second IR laser beam include using a blank wafer coated with metal having a melting point of less than 300° C.

18. The method of claim 17, wherein the metal comprises tin.

19. A method of dicing a semiconductor wafer, comprising:
- directing a first infrared (IR) laser beam at the bottom side of the semiconductor wafer, wherein the first IR laser beam is focused with a focus point embedded within a thickness of the semiconductor wafer, wherein parameters for the first IR laser beam are selected so that there is an embedded crack line formed within the semiconductor wafer, and wherein the embedded crack line does not reach a top surface of the top side;
- directing a second IR laser beam at the bottom side, wherein parameters for the second IR laser beam are selected to form a second crack line that has a spacing in a vertical direction relative to the embedded crack line to be extended by a crack extension to reach the surface of the top side, wherein the second IR laser beam is at an energy of no more than 70% of an energy of the first IR laser beam.

20. The method of claim 19, wherein natural crystal cleave planes are not used in separating a first die in the semiconductor wafer from a second die in the semiconductor wafer along the crack extension that reaches the surface of the top side.

21. The method of claim 19, wherein the first IR laser beam is implemented prior to implementation of the second IR laser beam.

\* \* \* \* \*